(12) United States Patent
Tani et al.

(10) Patent No.: US 6,727,747 B2
(45) Date of Patent: Apr. 27, 2004

(54) METHOD FOR REUSING RESOURCE FOR DESIGNING OPERATIONAL AMPLIFIER, LAYOUT GENERATING APPARATUS, AND LAYOUT GENERATING PROGRAM

(75) Inventors: Kuniyuki Tani, Ogaki (JP); Atsushi Wada, Ogaki (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/053,870

(22) Filed: Jan. 24, 2002

(65) Prior Publication Data
US 2002/0109543 A1 Aug. 15, 2002

(30) Foreign Application Priority Data
Jan. 29, 2001 (JP) ........................................ 2001-020755

(51) Int. Cl.[7] ................................................ H03F 3/45
(52) U.S. Cl. ........................................ 330/2; 330/261
(58) Field of Search ............................ 330/2, 254, 261

(56) References Cited

U.S. PATENT DOCUMENTS 4,947,063 A * 8/1990 O'Shaughnessy et al. .. 301/512
6,084,474 A * 7/2000 Lee ............................. 340/254
6,298,466 B1 * 10/2001 Dasgupta ................. 340/254 X

FOREIGN PATENT DOCUMENTS

JP 6-232264 8/1994
JP 7-262233 10/1995

OTHER PUBLICATIONS

Copy of Japanese Patent Office Notification of Reasons for Refusal for corresponding Japanese Patent Application No. 2001-020755 dated May 1, 2003 with translation.

* cited by examiner

Primary Examiner—Steven J. Mottola
(74) Attorney, Agent, or Firm—Armstrong, Kratz, Quintos, Hanson & Brooks, LLP

(57) ABSTRACT

Three kinds of shrink factors, 1 time, 0.5 time, and 0.25 time, are prepared and three sets of operational amplifier layout information are also prepared as a library in correspondence with the three kinds of shrink factors. At each shrink factor, the bias voltage is varied between upper and lower limits to vary the bias current.

17 Claims, 5 Drawing Sheets

METHOD FOR REUSING RESOURCE FOR DESIGNING OPERATIONAL AMPLIFIER, LAYOUT GENERATING APPARATUS, AND LAYOUT GENERATING PROGRAM

BACKGROUND OF THE INVENTION

1. Field of the Invention

The present invention relates to a method for reusing a resource for designing an operational amplifier, and to an operational amplifier, a layout generating apparatus and a layout generating program which can realize the method of reuse.

2. Description of the Background Art

When designing an operational amplifier, a designer determines various circuit constants such as the bias voltage, the size of each transistor (the gate width and the gate length) etc., to satisfy required characteristics such as the maximum operating frequency, slew rate, etc., and designs the layout pattern including circuit elements and interconnections which constitute the operational amplifier. In order to efficiently design the operational amplifier, existing design resources are reused when the specifications are changed.

In conventional reuse of design resources for operational amplifiers, the designer conducts a simulation and determines circuit constants such as the shrink factor (reducing scale), bias voltage, etc. so that the required characteristics are satisfied, and varies the layout pattern design of the operational amplifier.

In the conventional operational amplifier design resource reuse method, however, the circuit constants have so wide a choice that determining the circuit constants is a time-consuming work. Changing the layout pattern design is also time-consuming since the designer cannot achieve it by selecting an appropriate layout pattern out of a plurality of prepared layout patterns.

SUMMARY OF THE INVENTION

An object of the present invention is to provide a method for reusing a resource for designing an operational amplifier which can easily reuse an existing design resource and which can shorten the time required for the reuse, and an operational amplifier, a layout generating apparatus, and a layout generating program which can realize the method of reuse.

According to an aspect of the present invention, a method for reusing a resource for designing an operational amplifier comprises the steps of: preparing different sets of layout information for an operational amplifier comprising a plurality of transistors, the plurality of transistors having their channel widths varied by different factors among the different sets of operational amplifier layout information; and selecting one of the different sets of operational amplifier layout information and determining the value of a bias current of the operational amplifier so that a required characteristic is satisfied.

The method of reuse of the invention thus prepares different sets of operational amplifier layout information, where the channel widths of the plurality of transistors are varied in a uniform manner. Then one of the different sets of operational amplifier layout information is selected and the value of the bias current of the operational amplifier is determined, so as to design an operational amplifier which satisfies a required characteristic. An existing design resource can thus be easily reused and the time required for the reuse can be shortened.

The operational amplifier may have a circuit configuration in which a bias voltage generated by a bias generating circuit is applied to a transistor serving as a current source of the operational amplifier, thereby supplying a current corresponding to a constant multiple of a bias current of the bias generating circuit as a bias current of the operational amplifier, and the method of reuse may further comprise a step of previously setting a relation between the value of the bias current of the operational amplifier represented by the different sets of layout information and the value of the bias current of the bias generating circuit so that a set of operational amplifier layout information can be uniquely selected from the different sets of operational amplifier layout information and the value of the bias current of the bias generating circuit can be uniquely determined on the basis of the value of the bias current of the operational amplifier which satisfies the required characteristic.

In this case, the operational amplifier layout information can be uniquely selected from the different sets of operational amplifier layout information and the value of the bias current of the bias generating circuit can be uniquely determined. This remarkably reduces the work load and the time required for optimization to obtain the operational amplifier layout information which satisfies the required characteristic.

The operational amplifier design resource reuse method may further comprise a step of previously setting the different factors and the value of the bias current of the bias generating circuit so that the bias current of the operational amplifier continuously varies.

In this case, since the bias current of the operational amplifier can be continuously varied by varying the bias voltage of the bias generating circuit at each factor, one of the different sets of operational amplifier layout information and the value of the bias current of the operational amplifier can be easily selected and determined to satisfy the required characteristic.

The operational amplifier design resource reuse method may further comprise the steps of determining an upper limit of a bias voltage applied to a transistor serving as a current source of the operational amplifier on the basis of an output voltage range, and determining a lower limit of the bias voltage on the basis of cutoff of the transistor serving as a current source. This enables an optimum bias voltage to be selected.

It is preferred that the different factors include three or four kinds of factors. This remarkably reduces the design time for preparing the different sets of operational amplifier layout information corresponding to the different factors.

The plurality of transistors may further comprise a pair of transistors having a differential configuration and the transistor serving as a current source may supply a current to the pair of transistors. Also, each of the plurality of transistors may comprise a field-effect transistor.

According to another aspect of the invention, an operational amplifier comprises: a plurality of transistors including a transistor serving as a current source; a bias generating circuit that applies a bias voltage to the transistor serving as a current source; and a channel width varying circuit that varies channel widths of the plurality of transistors, thereby realizing a method for reusing a resource for designing an operational amplifier comprising preparing different sets of layout information for an operational amplifier comprising a plurality of transistors, the plurality of transistors having their channel widths varied by different factors among the different sets of operational amplifier layout information, and selecting one of the different sets of operational amplifier layout information and determining the value of a bias current of the operational amplifier so that a required characteristic is satisfied.

In the operational amplifier of the invention, the channel widths of the plurality of transistors can be varied by the channel width varying circuit, so that the operational amplifier design resource reuse method can be realized easily.

The operational amplifier may further comprise a bias voltage adjusting circuit that adjusts the bias voltage generated by the bias generating circuit.

In this case, the bias voltage can be adjusted by the bias voltage adjusting circuit, while the channel widths of the plurality of transistors can be varied by the channel width varying circuit. Then the operational amplifier design resource reuse method can be realized more easily.

The plurality of transistors may further include a pair of transistors having a differential configuration and the transistor serving as a current source may supply a current to the pair of transistors. Also, each of the plurality of transistors may comprise a field-effect transistor.

According to a further aspect of the invention, an operational amplifier comprises: a plurality of transistors including a transistor serving as a current source; a bias generating circuit that applies a bias voltage to the transistor serving as a current source; and a bias voltage adjusting circuit that adjusts the bias voltage generated by the bias generating circuit, thereby realizing a method for reusing a resource for designing an operational amplifier comprising preparing different sets of layout information for an operational amplifier comprising a plurality of transistors, the plurality of transistors having their channel widths varied by different factors among the different sets of operational amplifier layout information, and selecting one of the different sets of operational amplifier layout information and determining the value of a bias current of the operational amplifier so that a required characteristic is satisfied.

In the operational amplifier of the invention, the bias voltage can be adjusted by the bias voltage adjusting circuit, so that the operational amplifier design resource reuse method can be realized easily.

The plurality of transistors may further include a pair of transistors having a differential configuration and the transistor serving as a current source may supply a current to the pair of transistors. Also, each of the plurality of transistors may comprise a field-effect transistor.

According to another aspect of the invention, an operational amplifier comprises: a plurality of transistors including a transistor serving as a current source; a bias generating circuit that applies a bias voltage to the transistor serving as a current source; and a channel width varying circuit that varies channel widths of the plurality of transistors.

In the operational amplifier of the invention, the channel widths of the plurality of transistors can be varied by the channel width varying circuit. It is then possible to prepare different sets of operational amplifier layout information in which a plurality of transistors of the operational amplifier have their channel widths varied by different factors among the different sets of layout information, and then select one of the different sets of operational amplifier layout information and determine the value of the bias current of the operational amplifier, so as to satisfy a required characteristic. The operational amplifier design resource reuse method can thus be realized easily.

According to a further aspect of the invention, an operational amplifier comprises: a plurality of transistors including a transistor serving as a current source; a bias generating circuit that applies a bias voltage to the transistor serving as a current source; and a bias voltage adjusting circuit that adjusts the bias voltage generated by the bias generating circuit.

In the operational amplifier of the invention, the bias voltage can be adjusted by the bias voltage adjusting circuit. It is then possible to prepare different sets of operational amplifier layout information in which a plurality of transistors of the operational amplifier have their channel widths varied by different factors among the different sets of layout information, and then select one of the different sets of operational amplifier layout information and determine the value of the bias current of the operational amplifier, so as to satisfy a required characteristic. The operational amplifier design resource reuse method can thus be realized easily.

According to another aspect of the invention, an operational amplifier layout generating apparatus comprises: first input means for entering a characteristic required for an operational amplifier; second input means for entering different sets of layout information for the operational amplifier, the operational amplifier comprising a plurality of transistors, the plurality of transistors having their channel widths varied by different factors among the different sets of operational amplifier layout information; third input means for entering a relation between the value of a bias current of the operational amplifier represented by the different sets of layout information, and the different factors and the value of a bias current of a bias generating circuit; determining means for determining the bias current of the operational amplifier on the basis of the characteristic entered through the first input means; selecting means for determining the bias current of the bias generating circuit and selecting one of the different sets of operational amplifier layout information entered through the second input means on the basis of the relation entered through the third input means and the bias current of the operational amplifier determined by the determining means; executing means for executing a simulation about the operational amplifier using the set of operational amplifier layout information selected by the selecting means; and output means for outputting the layout information selected by the selecting means when a result of the simulation executed by the executing means satisfies the characteristic entered through the first input means.

In the operational amplifier layout generating apparatus of the invention, the first input means enters a characteristic required for an operational amplifier; the second input means enters different sets of layout information for the operational amplifier, where a plurality of transistors of the operational amplifier have their channel widths varied by different factors among the different sets of operational amplifier layout information; and the third input means enters a relation between the value of a bias current of the operational amplifier represented by the different sets of layout information, and the different factors and the value of a bias current of a bias generating circuit. Then, first, the determining means determines the bias current of the operational amplifier on the basis of the characteristic entered through the first input means. Next, the selecting means determines the bias current of the bias generating circuit and selects one of the different sets of operational amplifier layout information entered through the second input means on the basis of the relation entered through the third input means and the bias current of the operational amplifier determined by the determining means. Then the executing means executes a simulation about the operational amplifier using the set of layout information selected by the selecting means. When the results of the simulation executed by the executing means satisfy the characteristic entered through the first input means, the output means outputs the operational amplifier layout information selected by the selecting means.

The operational amplifier layout information which satisfies the required characteristic is thus automatically outputted, so that existing design resources can be easily reused and the time required for the reuse can be shortened.

A further aspect of the invention is directed to a layout generating program for generating a layout for an operational amplifier, wherein the layout generating program can be read by a computer, and the layout generating program causes the computer to execute a process comprising: accepting an input of a characteristic required for an operational amplifier; accepting an input of different sets of layout information for the operational amplifier, the operational amplifier comprising a plurality of transistors, the plurality of transistors having their channel widths varied by different factors among the different sets of operational amplifier layout information; accepting an input of a relation between the value of a bias current of the operational amplifier represented by the different sets of layout information, and the different factors and the value of a bias current of a bias generating circuit; determining the bias current of the operational amplifier on the basis of the entered characteristic; determining the bias current of the bias generating circuit and selecting one of the entered different sets of operational amplifier layout information on the basis of the entered relation and the determined bias current of the operational amplifier; executing a simulation about the operational amplifier using the selected set of operational amplifier layout information; and outputting the selected operational amplifier layout information when a result of the simulation satisfies the entered characteristic.

According to the operational amplifier layout generating program of the invention, first, the bias current of the operational amplifier is determined on the basis of the entered characteristic. Next, the bias current of the bias generating circuit is determined and one of the different sets of operational amplifier layout information is selected on the basis of the entered relation and the determined bias current of the operational amplifier. Further, a simulation about the operational amplifier is executed by using the selected set of layout information. When the results of the simulation satisfy the entered characteristic, the selected operational amplifier layout information is outputted.

The operational amplifier layout information which satisfies the required characteristic is thus automatically outputted, so that existing design resources can be easily reused and the time required for the reuse can be shortened.

According to another aspect of the invention, an operational amplifier layout generating apparatus comprises: a first input device that enters a characteristic required for an operational amplifier; a second input device that enters different sets of layout information for the operational amplifier, the operational amplifier comprising a plurality of transistors, the plurality of transistors having their channel widths varied by different factors among the different sets of operational amplifier layout information; a third input device that enters a relation between the value of a bias current of the operational amplifier represented by the different sets of layout information, and the different factors and the value of a bias current of a bias generating circuit; a processing unit that determines the bias current of the operational amplifier on the basis of the characteristic entered through the first input device, determines the bias current of the bias generating circuit and selects one of the different sets of operational amplifier layout information entered through the second input device on the basis of the relation entered through the third input device and the bias current of the operational amplifier determined by the determining device, and executes a simulation about the operational amplifier using the selected set of operational amplifier layout information; and an output device that outputs the selected layout information when a result of the simulation executed by the processing unit satisfies the characteristic entered through the first input device.

In the operational amplifier layout generating apparatus of the invention, the first input device enters a characteristic required for an operational amplifier, the second input device enters different sets of layout information for the operational amplifier, where a plurality of transistors of the operational amplifier have their channel widths varied by different factors among the different sets of operational amplifier layout information; and the third input device enters a relation between the value of a bias current of the operational amplifier represented by the different sets of layout information, and the different factors and the value of a bias current of a bias generating circuit. First, the processing unit determines the bias current of the operational amplifier on the basis of the characteristic entered through the first input device. Next, the processing unit determines the bias current of the bias generating circuit and selects one of the different sets of operational amplifier layout information entered through the second input device on the basis of the relation entered through the third input device and the bias current of the operational amplifier determined by the processing unit. Then the processing unit executes a simulation about the operational amplifier using the set of operational amplifier layout information selected by the processing unit. When the results of the simulation executed by the processing unit satisfy the characteristic entered through the first input device, the output device outputs the selected operational amplifier layout information.

The operational amplifier layout information which satisfies the required characteristic is thus automatically outputted, so that existing design resources can be easily reused and the time required for the reuse can be shortened.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
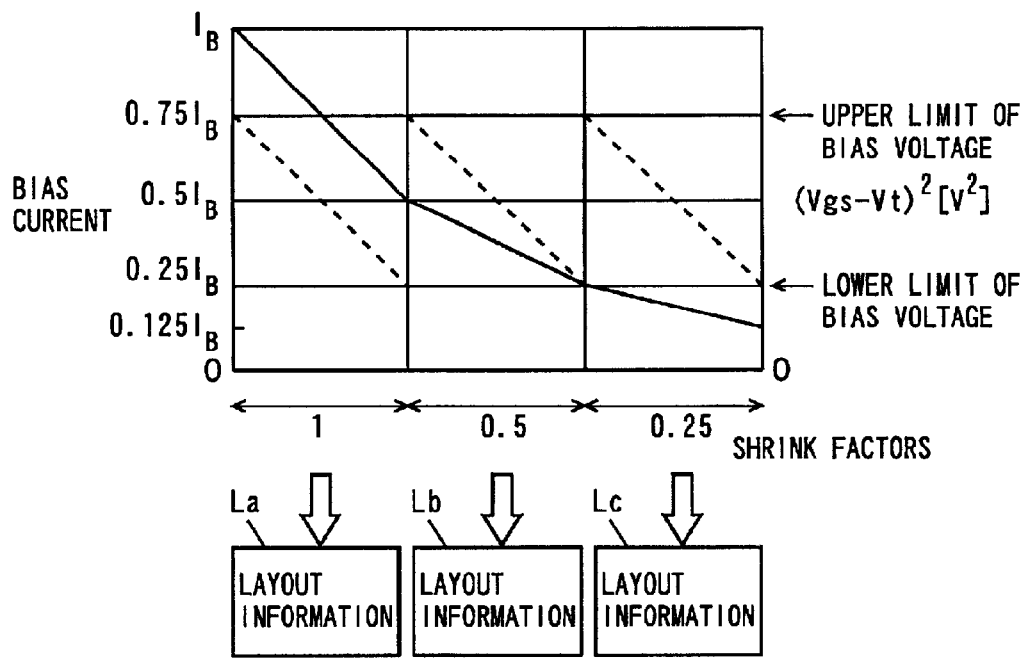
FIG. 1 is a schematic diagram showing an operational amplifier design resource reuse method according to an embodiment of the present invention.
Figure 2:
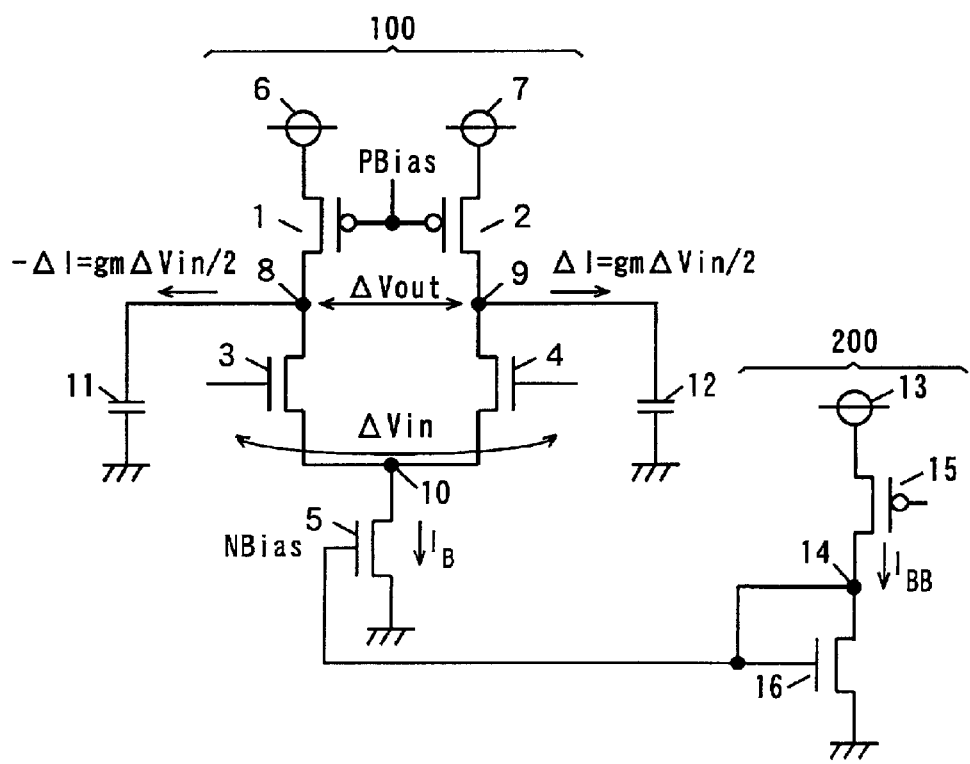
FIG. 2 is a circuit diagram showing an example of configuration of an operational amplifier and a bias generating circuit.

FIG. 1 is a schematic diagram showing a method for reusing resources for designing operational amplifiers according to an embodiment of the present invention. FIG. 2 is a circuit diagram showing an example of the configuration of an operational amplifier and a bias generating circuit.

The operational amplifier 100 shown in FIG. 2 includes load transistors 1 and 2 formed of P-channel field-effect transistors, input transistors 3 and 4 formed of N-channel field-effect transistors, and a current-source transistor 5 formed of an N-channel field-effect transistor.

The load transistors 1 and 2 are respectively connected between power-supply terminals 6 and 7 which receive a power-supply voltage and output nodes 8 and 9. A bias voltage PBias is given to the gate electrodes of the load transistors 1 and 2. An output voltage ΔVout appears between the output nodes 8 and 9. The input transistors 3 and 4 are connected respectively between the output nodes 8 and 9 and a common node 10. An input voltage ΔVin is given to the gate electrodes of the input transistors 3 and 4. The current-source transistor 5 is connected between the common node 10 and a ground terminal. A bias voltage NBias generated by the bias generating circuit 200 is given to the gate electrode of the current-source transistor 5. The current-source transistor 5 constitutes a constant-current source.

The operational amplifier shown in FIG. 2 has a differential structure, and the transistors 1, 2, 3, 4 and 5 operate in the saturation region.

Now, the bias current flowing through the load transistors 1 and 2 and the input transistors 3 and 4 is taken as $I_B/2$, the bias current flowing through the current-source transistor 5 as $I_B$, the transconductance of the input transistors 3 and 4 as gm, and the capacitance value of the load capacitors 11 and 12 as $C_L$. Important characteristics of the operational amplifier, i.e. the maximum operating frequency f and the slew rate SR, are expressed by the equations below:

$$f = gm/(C_L \cdot 2\pi) \quad (1)$$

$$SR = I_B/C_L \quad (2)$$

When the current flowing through the input transistors 3 and 4 in the saturated condition is taken as $I_B/2 = \beta(V_{GS} - V_T)^2$, then $gm = 2(\beta I_B/2)^{0.5}$ and $\beta \propto W/L$. Where $V_{GS}$ is the gate-to-source voltage of the input transistors 3 and 4, $V_T$ is the threshold voltage of the input transistors 3 and 4, W is the gate width of the input transistors 3 and 4, and L is the gate length of the input transistors 3 and 4.

When the gate voltage of the input transistor 3 is higher than the gate voltage of the input transistor 4, then the current ΔI outputted from the output node 8 is expressed as ΔI=−gm·ΔVin/2 and the current ΔI outputted from the output node 9 is expressed as ΔI=+gm·ΔVin/2.

Equations (1) and (2) show that the maximum operating frequency f and the slew rate SR depend on the bias current $I_B$.

For example, when resources for designing an operational amplifier which operates at a maximum operating frequency of 20 MHz are already available and an operational amplifier which operates at a maximum operating frequency of 50 MHz is newly designed, the circuit configuration of the operational amplifier with the maximum operating frequency of 50 MHz is the same as that of the operational amplifier with the maximum operating frequency of 20 MHz. In this case the frequency characteristics can be varied by changing the bias current.

The bias current $I_B$ can be changed by changing the sizes of the transistors 1 to 5 forming the operational amplifier 100, or by changing the value of the bias voltage NBias to the current-source transistor 5. The size of a transistor means the channel width (the gate width). When changing the sizes of the transistors 1 to 5, the channel widths of all transistors 1 to 5 are uniformly reduced or enlarged according to a certain ratio (a shrink factor).

The bias generating circuit 200 includes a P-channel field-effect transistor 15 and an N-channel field-effect transistor 16.

The transistor 15 is connected between a power-supply terminal 13 which receives a power-supply voltage and an output node 14. A given voltage is applied to the gate electrode of the transistor 15. The transistor 16 is connected between the output node 14 and a ground terminal. The gate electrode of the transistor 16 is connected to the output node 14. A bias current $I_{BB}$ flows through the transistors 15 and 16. Then the bias voltage NBias is outputted from the output node 14. The transistor 15 forms a constant-current source.

Now the ratio between the bias current $I_B$ of the operational amplifier 100 and the bias current $I_{BB}$ of the bias generating circuit 200 is determined by the ratio between the size (the channel width) of the current-source transistor 5 in the operational amplifier 100 and the size (the channel width) of the transistor 16 in the bias generating circuit 200. When the ratio between the size of the current-source transistor 5 in the operational amplifier 100 and the size of the transistor 16 in the bias generating circuit 200 is taken as "k," then the bias current $I_B$ of the operational amplifier 100 is expressed as:

$$I_B = kI_{BB}$$

The value of the bias voltage NBias has an upper limit and a lower limit. In the operational amplifier 100 of FIG. 2, the upper limit value of the bias voltage NBias is determined by the output voltage range. When the bias current $I_B$ is increased with the sizes of the transistors 1 to 5 kept unchanged, the output voltage range in which each of the transistors 1 to 5 operates in the saturation condition becomes smaller. The lower limit value of the bias voltage NBias is determined according to whether the current-source transistor 5 is cut off because of noise generated at the ground potential. When the bias voltage NBias is too low, the gate-to-source voltage Vgs of the current-source transistor 5 may become lower than the threshold voltage Vt due to the variation in the ground potential, and then the current-source transistor 5 will be cut off. The bias voltage NBias must therefore be varied between the upper limit and the lower limit.

Next, the operational amplifier design resource reuse method of this embodiment is described referring to FIG. 1. In FIG. 1, the horizontal axis shows the ratios (shrink factors) for varying the channel widths of the transistors 1 to 5 of the operational amplifier 100 and the vertical axis shows the bias current of the operational amplifier 100, the bias current of the bias generating circuit 200, and $(Vgs-Vt)^2$.

The gate-to-source voltage Vgs of the current-source transistor 5 corresponds to the bias voltage NBias. In FIG. 1, the solid line shows the variation of the bias current and the dotted line shows the variation of $(Vgs-Vt)^2$.

In the method of reuse of this embodiment, as shown in FIG. 1, three kinds of shrink factors, 1 time (equal scale), 0.5 time, and 0.25 time, are prepared, and sets of operational amplifier layout information of three kinds, La, Lb and Lc, are prepared as a library in correspondence with the three kinds of shrink factors. At each shrink factor, the bias voltage is varied between the upper and lower limits to vary the bias current.

The layout information La, Lb and Lc contain the same connection information and layout, except for the sizes of the transistors 1 to 5. The sets of layout information La, Lb and Lc include circuit connection information and layout of the operational amplifier 100, and the layout includes the arrangement and interconnect pattern of the transistors 1 to 5 which constitute the operational amplifier 100.

As shown in FIG. 1, when the bias voltage NBias is varied from the upper limit to the lower limit at the shrink factor of 1 time, the bias current varies from $I_B$ to $0.5I_B$. When the bias voltage NBias is varied from the upper limit to the lower limit at the shrink factor of 0.5 time, the bias current $I_B$ varies from $0.5I_B$ to $0.25I_B$. Further, when the bias voltage NBias is varied from the upper limit to the lower limit at the shrink factor of 0.25 time, the bias current $I_B$ varies from $0.25I_B$ to $0.125I_B$.

As shown above, the bias current can be realized between $I_B$ and $0.125I_B$ by preparing the three kinds of layout information La, Lb, Lc and varying the bias voltage NBias. When the bias voltage NBias is set, the voltages at the nodes 8, 9 and 10 are equal among the three kinds of layout information La, Lb and Lc.

The shrink factor and the bias voltage NBias can thus be easily determined from the bias current $I_B$ which satisfies required characteristics. In this case, the three kinds of operational amplifier layout information La, Lb and Lc are prepared in advance, which shortens the time required to design the layout information.

In the embodiment shown above, with three kinds of shrink factors prepared, and with three kinds of operational amplifier layout information correspondingly prepared as a library, the bias current is varied by varying the bias voltage from the upper limit to the lower limit at the individual shrink factors. However, the shrink factors are not limited to three kinds. For example, four or five kinds of shrink factors may be prepared, and then sets of operational amplifier layout information of four or five kinds are prepared correspondingly, and the bias current can be varied by varying the bias voltage from the upper limit to the lower limit at the individual shrink factors.

However, in order to shorten the design time for preparing the operational amplifier layout information, it is preferable to prepare three or four kinds of shrink factors and, correspondingly, three or four kinds of operational amplifier layout information as a library.

Also, the operational amplifier design resource reuse method of this embodiment can be applied not only to operational amplifiers having the structure shown in FIG. 2, but can be applied in the same way also to operational amplifiers having other configurations.

Figure 3:
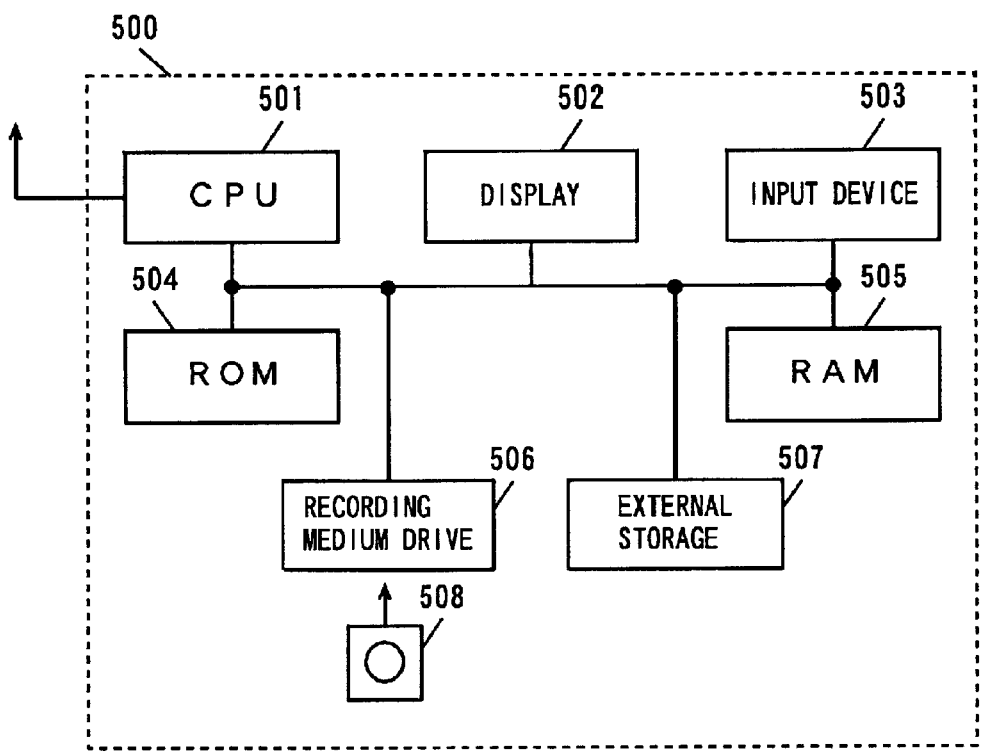
FIG. 3 is a block diagram showing the configuration of an operational amplifier layout generating apparatus.

Next, an operational amplifier layout generating apparatus for realizing the operational amplifier design resource reuse method shown in FIG. 1 is explained. FIG. 3 is a block diagram showing the configuration of an operational amplifier layout generating apparatus.

In FIG. 3, the layout generating apparatus 500 includes a CPU (central processing unit) 501, a display 502, an input device 503, a ROM (read-only memory) 504, a RAM (random access memory) 505, a recording medium drive 506, and an external storage 507.

The display 502, formed of a liquid crystal display, a CRT (cathode ray tube), or the like, displays various images. The input device 503, formed of a keyboard, a mouse, etc., is used to enter various information.

The ROM 504 stores a system program. The recording medium drive 506, formed of a CD-ROM drive, a floppy disk drive, etc., writes and reads data into and from a recording medium 508, e.g. a CD-ROM, a floppy disk, etc. A layout generating program is recorded on the recording medium 508. The external storage 507, formed of a hard disk device etc., stores the layout generating program which is read from the recording medium 508 through the recording medium drive 506.

The CPU 501 executes, on the RAM 505, the layout generating program stored in the external storage 507, and controls individual components.

The layout generating apparatus 500 is composed of a personal computer and the layout generating program recorded on the recording medium 508, for example.

Various recording media can be used as the recording medium 508 for recording the layout generating program, such as a semiconductor memory like a ROM, a hard disk, etc. The layout generating program may be downloaded into the external storage 507 through a communication medium, e.g. a communication line, and executed on the RAM 505.

In this embodiment, the input device 503 corresponds to the first and third input means or the first and third input devices, the external storage 507 corresponds to the second input means or the second input device, the CPU 501 corresponds to the determining means, selecting means and executing means, or to the processing unit, and the display 502 corresponds to the output means or the output device.

Figure 4:
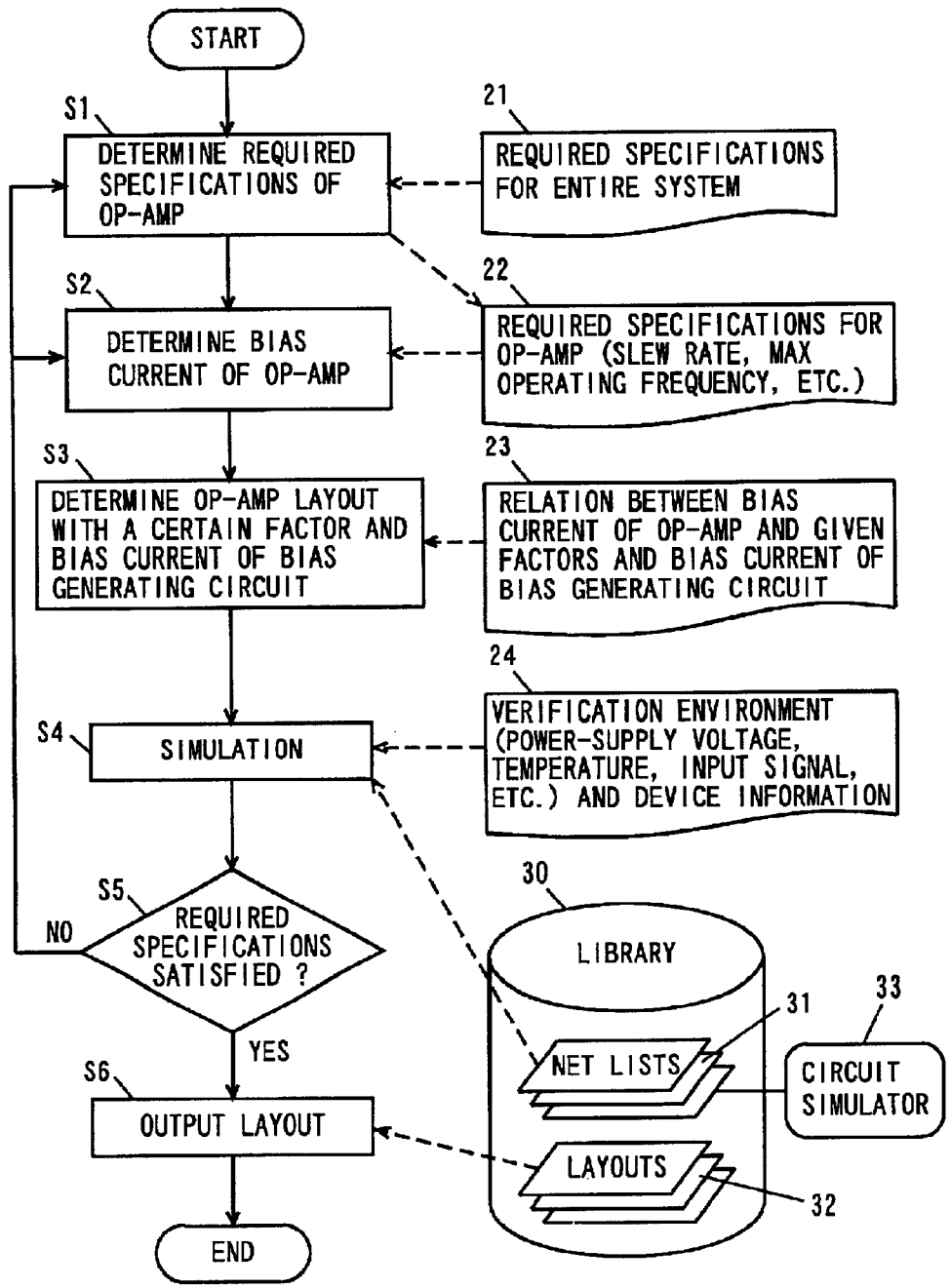
FIG. 4 is a flowchart showing the operational amplifier design resource reuse method shown in FIG. 1.

FIG. 4 is a flowchart showing a layout generating processing using the layout generating apparatus of FIG. 3. In the flowchart of FIG. 4, Step S1 is carried out by a designer and Steps S2 to S6 are processed by the layout generating program in the layout generating apparatus 500 of FIG. 3.

A plurality of kinds of net lists 31 and a plurality of kinds of layouts 32 are prepared as a library 30. The net lists 31 include information about circuit connections in the operational amplifier and the sizes (channel widths) of the plurality of transistors which constitute the operational amplifier. The layouts 32 include the arrangement and interconnection pattern of the plurality of transistors constituting the operational amplifier.

First, the designer determines specifications required for the operational amplifier on the basis of required specifications 21 about the entire system including the operational amplifier (Step S1) and thus obtains required specifications 22 about the operational amplifier; the required specifications 22 include the slew rate, maximum operating frequency, etc.

The designer then enters the required specifications 22 thus obtained into the layout generating apparatus 500 by using the input device 503. The CPU 501 in the layout generating apparatus 500 then selects a circuit configuration of the operational amplifier and determines the bias current of the operational amplifier on the basis of the entered required specifications 22 (Step S2).

Next, the designer enters, into the layout generating apparatus 500 by using the input device 503, a relation 23 between the bias current of the operational amplifier and the given factors (shrink factors) and the bias current of the bias generating circuit. Then, on the basis of the entered relation 23, the CPU 501 in the layout generating apparatus 500 selects a layout 32 with a certain factor from the plurality of layouts 32 prepared as the library 30 and determines the bias current (bias voltage) of the bias generating circuit so that the bias current of the operational amplifier determined in Step S2 can be satisfied (Step S3).

The designer also enters, into the layout generating apparatus 500 by using the input device 503, verification environment and device information 24; the verification environment includes the power-supply voltage, temperature, input signals, etc., and the device information includes the characteristics of the transistors which constitute the operational amplifier.

By using the entered verification environment and device information 24, the net lists 31 prepared as the library 30, and an analog function describing language, the CPU 501 in the layout generating apparatus 500 carries out a simulation of the layout 32 selected in Step S3 (Step S4). During this process the CPU 501 uses a circuit simulator 33.

When the results of the simulation do not satisfy the required specifications (Step S5), the flow returns to Step S2 to determine the bias current of the operational amplifier again. The processing of Steps S2 to S5 is repeated until the simulation results satisfy the required specifications. When the simulation results satisfy the required specifications (Step S5), the selected layout 32 is outputted to, e.g. the screen of the display 502, and also stored in the external storage 507 (Step S6).

In Step S5, when the simulation results do not satisfy the required specifications, the flow may return to Step S1 to determine the specifications required for the operational amplifier again.

While, in the example of FIG. 4, the simulation of Step S4 is carried out by using the external circuit simulator 33, the simulation of Step S4 may be performed by the layout generating program itself.

Figure 5:
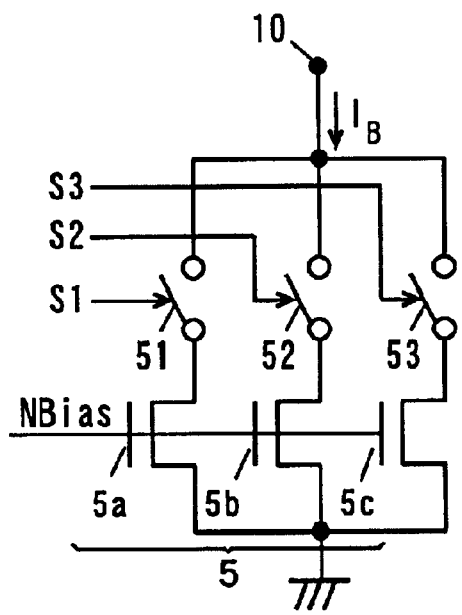
FIG. 5 is a circuit diagram showing a configuration of a channel width varying circuit which can realize the operational amplifier design resource reuse method shown in FIG. 1.

FIG. 5 is a circuit diagram showing an example of configuration of a channel width varying circuit which can realize the operational amplifier design resource reuse method of FIG. 1.

As shown in FIG. 5, the current-source transistor 5 in the operational amplifier 100 shown in FIG. 2 includes a plurality of N-channel field-effect transistors 5a, 5b and 5c. The plurality of transistors 5a, 5b and 5c have their respective source electrodes connected to the ground terminal and their respective drain electrodes connected to the common node 10 respectively through switches 51, 52 and 53. The bias voltage NBias generated from the bias generating circuit 200 shown in FIG. 2 is given to the gate electrodes of the plurality of transistors 5a, 5b and 5c. The switches 51, 52 and 53 are selectively turned on or off by switch signals S1, S2 and S3.

As shown above, an arbitrary number of transistor or transistors, 5a, 5b, 5c, can be connected in parallel between the common node 10 and the ground terminal by turning on/off the switches 51, 52 and 53 with the switch signals S1, S2 and S3. The channel width of the current-source transistor 5 can thus be varied among a plurality of kinds of values.

In the operational amplifier 100 shown in FIG. 2, the load transistors 1 and 2 and the input transistors 3 and 4 are constructed in the same way as the current-source transistor 5 shown in FIG. 5, so that the channel widths of the plurality of transistors 1 to 5 which constitute the operational amplifier 100 can be varied in a uniform way among a plurality of kinds of values.

Figure 6:
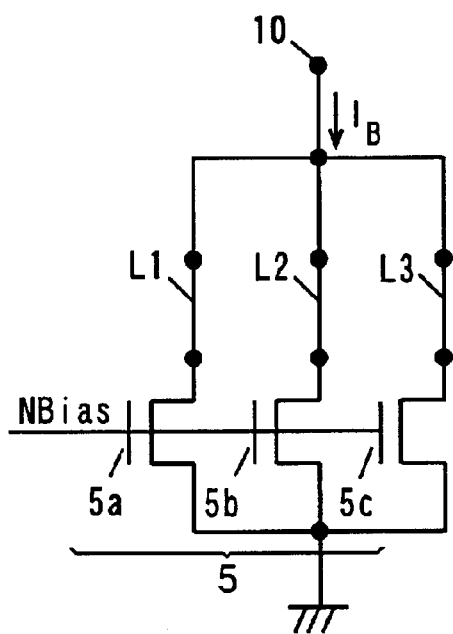
FIG. 6 is a circuit diagram showing another configuration of the channel width varying circuit which can realize the operational amplifier design resource reuse method shown in FIG. 1.

FIG. 6 is a circuit diagram showing another example of the channel width varying circuit which can realize the operational amplifier design resource reuse method of FIG. 1.

As shown in FIG. 6, the current-source transistor 5 in the operational amplifier 100 shown in FIG. 2 includes a plurality of N-channel field-effect transistors 5a, 5b and 5c. The plurality of transistors 5a, 5b and 5c have their respective source electrodes connected to the ground terminal and their respective drain electrodes connected to the common node 10 respectively through interconnection patterns L1, L2 and L3. The bias voltage NBias generated from the bias generating circuit 200 shown in FIG. 2 is given to the gate electrodes of the plurality of transistors 5a, 5b and 5c.

An arbitrary number of transistor or transistors, 5a, 5b, 5c, can be connected in parallel between the common node 10 and the ground terminal by, during the manufacturing process, forming the individual interconnection patterns L1, L2 and L3 into a connected state or a disconnected state. The channel width of the current-source transistor 5 can thus be varied among a plurality of kinds of values.

In the operational amplifier 100 shown in FIG. 2, the load transistors 1 and 2 and the input transistors 3 and 4 are constructed in the same way as the current-source transistor 5 shown in FIG. 6, so that the channel widths of the plurality of transistors 1 to 5 which constitute the operational amplifier 100 can be uniformly varied among a plurality of kinds of values.

Figure 7:
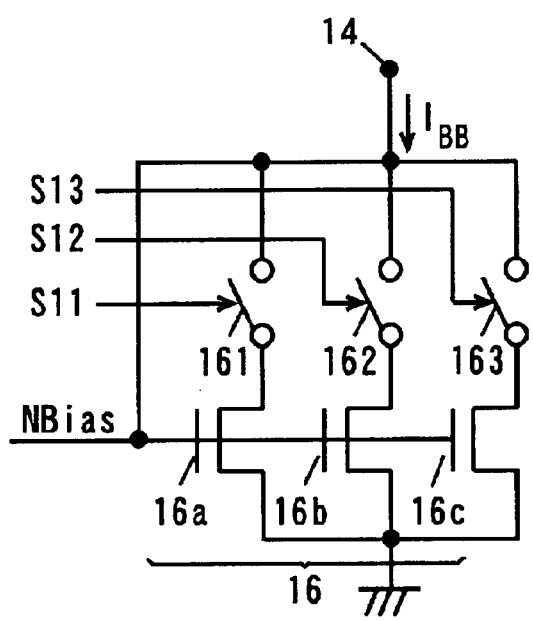
FIG. 7 is a circuit diagram showing a configuration of a bias voltage adjusting circuit which can realize the operational amplifier design resource reuse method shown in FIG. 1.

FIG. 7 is a circuit diagram showing an example of configuration of a bias voltage adjusting circuit which can realize the operational amplifier design resource reuse method of FIG. 1.

As shown in FIG. 7, the transistor 16 in the bias generating circuit 200 shown in FIG. 2 includes a plurality of N-channel field-effect transistors 16a, 16b and 16c. The plurality of transistors 16a, 16b and 16c have their respective source electrodes connected to the ground terminal and their respective drain electrodes connected to the output node 14 respectively through switches 161, 162 and 163. The gate electrodes of the plurality of transistors 16a, 16b and 16c are connected to the output node 14. The switches 161, 162 and 163 are selectively turned on/off by switch signals S11, S12 and S13.

As shown above, an arbitrary number of transistor or transistors, 16a, 16b, 16c, can be connected in parallel between the output node 14 and the ground terminal by turning on/off the switches 161, 162, and 163 with the switch signals S11, S12 and S13. The bias voltage NBias can thus be adjusted.

Figure 8:
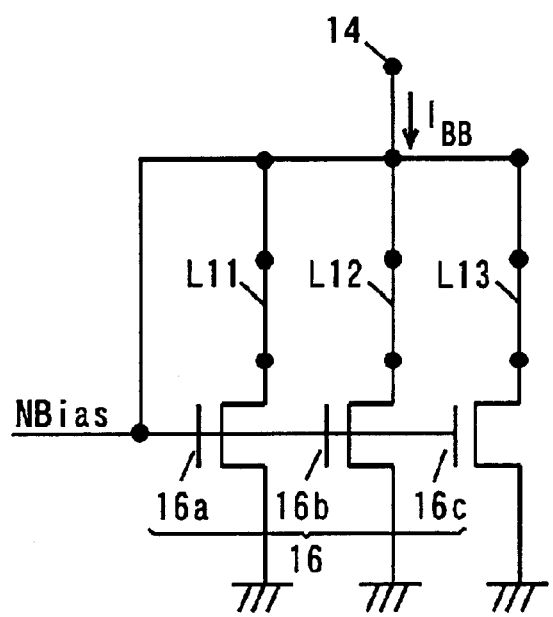
FIG. 8 is a circuit diagram showing another configuration of the bias voltage adjusting circuit which can realize the operational amplifier design resource reuse method shown in FIG. 1.

FIG. 8 is a circuit diagram showing another example of configuration of the bias voltage adjusting circuit which can realize the operational amplifier design resource reuse method of FIG. 1.

As shown in FIG. 8, the transistor 16 in the bias generating circuit 200 shown in FIG. 2 includes a plurality of N-channel field-effect transistors 16a, 16b and 16c. The plurality of transistors 16a, 16b and 16c have their respective source electrodes connected to the ground terminal and their respective drain electrodes connected to the output node 14 respectively through interconnection patterns L11, L12 and L13. The gate electrodes of the plurality of transistors 16a, 16b and 16c are connected to the output node 14.

An arbitrary number of transistor or transistors, 16a, 16b, 16c, can be connected in parallel between the output node 14 and the ground terminal by, during the manufacturing process, forming the individual interconnection patterns L11, L12 and L13 in a connected state or a disconnected state. The bias voltage NBias can thus be adjusted.

The operational amplifier 100 and the bias generating circuit 200 may be provided with both or one of the channel width varying circuit shown in FIG. 5 or FIG. 6 and the bias voltage adjusting circuit shown in FIGS. 7 or 8.

While the invention has been described in detail, the foregoing description is in all aspects illustrative and not restrictive. It is understood that numerous other modifications and variations can be devised without departing from the scope of the invention.

What is claimed is:

1. A method for reusing a resource for designing an operational amplifier, comprising the steps of:

preparing different sets of layout information for an operational amplifier comprising a plurality of transistors, said plurality of transistors having their channel widths varied by different factors among said different sets of operational amplifier layout information; and selecting one of said different sets of operational amplifier layout information and determining the value of a bias current of said operational amplifier so that a required characteristic is satisfied.

2. The method for reusing a resource for designing an operational amplifier according to claim 1, wherein said operational amplifier has a circuit configuration in which a bias voltage generated by a bias generating circuit is applied to a transistor serving as a current source of said operational amplifier, thereby supplying a current corresponding to a constant multiple of a bias current of said bias generating circuit as a bias current of said operational amplifier, said method of reusing further comprising a step of previously setting a relation between the value of the bias current of the operational amplifier represented by said different sets of layout information and the value of the bias current of said bias generating circuit so that a set of operational amplifier layout information can be uniquely selected from said different sets of operational amplifier layout information and the value of the bias current of said bias generating circuit can be uniquely determined on the basis of the value of the bias current of said operational amplifier which satisfies said required characteristic.

3. The method for reusing a resource for designing an operational amplifier according to claim 2, further comprising a step of previously setting said different factors and the value of the bias current of said bias generating circuit so that the bias current of said operational amplifier continuously varies.

4. The method for reusing a resource for designing an operational amplifier according to claim 2, further comprising the steps of determining an upper limit of a bias voltage applied to a transistor serving as a current source of said operational amplifier on the basis of an output voltage range and determining a lower limit of said bias voltage on the basis of cutoff of said transistor serving as a current source.

5. The method for reusing a resource for designing an operational amplifier according to claim 1, wherein said different factors include three or four different factors.

6. The method for reusing a resource for designing an operational amplifier according to claim 2, wherein said plurality of transistors further comprise a pair of transistors having a differential configuration and said transistor serving as a current source supplies a current to said pair of transistors.

7. The method for reusing a resource for designing an operational amplifier according to claim 1, wherein each of said plurality of transistors comprises a field-effect transistor.

8. An operational amplifier, comprising: a plurality of composite transistors including a composite transistor serving as a current source; a bias generating circuit that applies a bias voltage to said composite transistor serving as a current source; and an effective channel width varying circuit that varies the effective channel widths of said plurality of composite transistors, thereby realizing a method for reusing a resource for designing an operational amplifier comprising preparing different sets of layout information for an operational amplifier comprising a plurality of composite transistors, said plurality of composite transistors having their effective channel widths varied by different factors among said different sets of operational amplifier layout information, and selecting one of said different sets of operational amplifier layout information and determining the value of a bias current of said operational amplifier so that a required characteristic is satisfied.

9. The operational amplifier according to claim 8, further comprising a bias voltage adjusting circuit that adjusts the bias voltage generated by said bias generating circuit.

10. The operational amplifier according to claim 8, wherein said plurality of composite transistors further include a pair of composite transistors having a differential configuration and said composite transistor serving as a current source supplies a current to said pair of composite transistors.

11. An operational amplifier, comprising:

a plurality of transistors including a transistor serving as a current source;

a bias generating circuit that applies a bias voltage to said transistor serving as a current source; and a bias voltage adjusting circuit that adjusts the bias voltage generated by said bias generating circuit, thereby realizing a method for reusing a resource for designing an operational amplifier comprising preparing different sets layout information for an operational amplifier comprising a plurality of transistors, said plurality of transistors having their channel widths varied by different factors among said different sets of operational amplifier layout information, and selecting one of said different sets of operational amplifier layout information and determining the value of a bias current of said operational amplifier so that a required characteristic is satisfied.

12. The operational amplifier according to claim 11, wherein said plurality of transistors further include a pair of transistors having a differential configuration and said transistor serving as a current source supplies a current to said pair of transistors.

13. An operational amplifier, comprising:

a plurality of composite transistors including a composite transistor serving as a current source;

a bias generating circuit that applies a bias voltage to said composite transistor serving as a current source; and an effective channel width varying circuit that varies the effective channel widths of said plurality of composite transistors.

14. An operational amplifier layout generating apparatus, comprising:

first input means for entering a characteristic required for an operational amplifier;

second input means for entering different sets of layout information for the operational amplifier, said operational amplifier comprising a plurality of transistors, said plurality of transistors having their channel widths varied by different factors among said different sets of operational amplifier layout information;

third input means for entering a relation between the value of a bias current of the operational amplifier represented by said different sets of layout information, and said different factors and the value of a bias current of a bias generating circuit; determining means for determining the bias current of said operational amplifier on the basis of said characteristic entered through said first input means;

selecting means for determining the bias current of said bias generating circuit and selecting one of said different sets of operational amplifier layout information entered through said second input means on the basis of said relation entered through said third input means and the bias current of said operational amplifier determined by said determining means;

executing means for executing a simulation about the operational amplifier using the set of operational amplifier layout information selected by said selecting means; and output means for outputting the layout information selected by said selecting means when a result of the simulation executed by said executing means satisfies the characteristic entered through said first input means.

15. An operational amplifier layout generating program for generating a layout for an operational amplifier, said layout generating program being capable of being read by a computer, said layout generating program causing said computer to execute a process comprising, accepting an input of a characteristic required for an operational amplifier;

accepting an input of different sets of layout information for the operational amplifier, said operational amplifier comprising a plurality of transistors, said plurality of transistors having their channel widths varied by different factors among said different sets of operational amplifier layout information;

accepting an input of a relation between the value of a bias current of the operational amplifier represented by said different sets of layout information, and said different factors and the value of a bias current of a bias generating circuit;

determining the bias current of said operational amplifier on the basis of said entered characteristic;

determining the bias current of said bias generating circuit and selecting one of said entered different sets of operational amplifier layout information on the basis of said entered relation and said determined bias current of said operational amplifier;

executing a simulation about the operational amplifier using the selected set of operational amplifier layout information; and outputting the selected operational amplifier layout information when a result of the simulation satisfies said entered characteristic.

16. An operational amplifier layout generating apparatus, comprising a first input device that enters a characteristic required for an operational amplifier;

a second input device that enters different sets of layout information for the operational amplifier, said operational amplifier comprising a plurality of transistors, said plurality of transistors having their channel widths varied by different factors among said different sets of operational amplifier layout information;

a third input device that enters a relation between the value of a bias current of the operational amplifier represented by said different sets of layout information, and said different factors and the value of a bias current of a bias generating circuit;

a processing unit that determines the bias current of said operational amplifier on the basis of said characteristic entered through said first input device, determines the bias current of said bias generating circuit and selects one of said different sets of operational amplifier layout information entered through said second input device on the basis of said relation entered through said third input device and said determined bias current of said operational amplifier, and executes a simulation about the operational amplifier using said selected set of operational amplifier layout information; and an output device that outputs said selected layout information when a result of the simulation executed by said processing unit satisfies the characteristic entered through said first input device.

17. An operational amplifier, comprising:

a plurality of transistors including a transistor serving as a current source;

a bias generating circuit that applies a bias voltage to said transistor serving as a current source; and a bias voltage adjusting circuit that adjusts the bias voltage generated by said bias generating circuit to change the current flowing through said transistor serving as a current source, wherein said bias voltage adjusting circuit comprises a plurality of switches for adjusting the bias voltage among a plurality of values.

* * * * *